(12) United States Patent
Shim et al.

(10) Patent No.: US 9,299,648 B2
(45) Date of Patent: Mar. 29, 2016

(54) INTEGRATED CIRCUIT PACKAGING SYSTEM WITH PATTERNED SUBSTRATE AND METHOD OF MANUFACTURE THEREOF

(75) Inventors: Il Kwon Shim, Singapore (SG); Seng Guan Chow, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 877 days.

(21) Appl. No.: 12/714,291

(22) Filed: Feb. 26, 2010

(65) Prior Publication Data

US 2010/0224974 A1 Sep. 9, 2010

Related U.S. Application Data

(60) Provisional application No. 61/157,550, filed on Mar. 4, 2009.

(51) Int. Cl.
*H01L 23/02* (2006.01)
*H01L 23/498* (2006.01)
*H01L 23/31* (2006.01)
*H01L 25/10* (2006.01)

(52) U.S. Cl.
CPC ...... *H01L 23/49816* (2013.01); *H01L 23/3128* (2013.01); *H01L 25/105* (2013.01); *H01L 23/49822* (2013.01); *H01L 23/49827* (2013.01); *H01L 2224/14181* (2013.01); *H01L 2224/16225* (2013.01); *H01L 2224/1703* (2013.01); *H01L 2224/17181* (2013.01); *H01L 2224/17519* (2013.01); *H01L 2224/32225* (2013.01); *H01L 2224/73204* (2013.01); *H01L 2225/1023* (2013.01); *H01L 2225/1058* (2013.01); *H01L 2924/15311* (2013.01); *H01L 2924/15331* (2013.01); *H01L 2924/3511* (2013.01)

(58) Field of Classification Search
CPC .............. H01L 23/3128; H01L 23/49816; H01L 2225/1058; H01L 2225/1023
USPC .......................................................... 257/685
See application file for complete search history.

(56) References Cited

U.S. PATENT DOCUMENTS

| | | | |
|---|---|---|---|
| 5,924,623 | A | 7/1999 | Kenney |
| 7,573,135 | B2 | 8/2009 | Sunohara et al. |
| 7,580,240 | B2 | 8/2009 | Yamamoto et al. |
| 7,642,133 | B2 | 1/2010 | Wu et al. |
| 7,714,453 | B2 | 5/2010 | Khan et al. |
| 2004/0227236 | A1* | 11/2004 | Sawamoto .............. 257/734 |
| 2006/0040423 | A1 | 2/2006 | Savastibuk et al. |
| 2006/0151865 | A1* | 7/2006 | Han et al. ............... 257/686 |
| 2007/0273049 | A1 | 11/2007 | Khan et al. |

(Continued)

OTHER PUBLICATIONS

U.S. Appl. No. 12/714,320, filed Feb. 26, 2010, Yang et al.

*Primary Examiner* — Ori Nadav
(74) *Attorney, Agent, or Firm* — Ishimaru & Associates LLP

(57) ABSTRACT

A method of manufacture of an integrated circuit packaging system includes: providing a package substrate having a component side and a system side; depositing a solder resist layer on the component side of the package substrate; patterning groups of access openings and a die mount opening in the solder resist layer; attaching an integrated circuit die in the die mount opening; forming conductive contacts in the access openings; and attaching system interconnects to the system side of the package substrate including controlling a coplanarity of the system interconnects by the solder resist layer.

20 Claims, 4 Drawing Sheets

(56) References Cited

U.S. PATENT DOCUMENTS

| | | |
|---|---|---|
| 2008/0073769 A1 | 3/2008 | Wu et al. |
| 2009/0034225 A1 | 2/2009 | Shoji et al. |
| 2009/0250810 A1 | 10/2009 | Pendse |
| 2010/0000775 A1 | 1/2010 | Shen et al. |
| 2010/0025844 A1 | 2/2010 | Yamazaki |

* cited by examiner

INTEGRATED CIRCUIT PACKAGING SYSTEM WITH PATTERNED SUBSTRATE AND METHOD OF MANUFACTURE THEREOF

CROSS-REFERENCE TO RELATED APPLICATION

This application claims the benefit of U.S. Provisional Patent Application Ser. No. 61/157,550 filed Mar. 4, 2009, and the subject matter thereof is incorporated herein by reference thereto.

The present application contains subject matter related to concurrently filed U.S. patent application Ser. No. 12/714,320 filed Feb. 26, 2010, now U.S. Pat. No. 8,067,306. The related application is assigned to STATS ChipPAC Ltd. The subject matter thereof is incorporated herein by reference thereto.

TECHNICAL FIELD

The present invention relates generally to integrated circuit packaging systems, and more particularly to a system with a solder resist patterned substrate.

BACKGROUND ART

In the electronics industry, as products such as cell phones, camcorders and digital media players become smaller and smaller, increased miniaturization of integrated circuit (IC) or chip packages has become more and more critical. At the same time, higher performance and lower cost have become essential for new products.

In response to the demands for newer packaging, many innovative package designs have been conceived and brought to market. One type of package achieves smaller size through thinner package substrates upon which individual or multiple chips are mounted. In these thinner packages, a number of problems have arisen.

In particular, for technology in which flip chip interconnection is employed to interconnect the chip to the package substrate, warpage of the package substrate has become a significant limitation making it difficult to meet typical coplanarity specifications for such packages.

In a typical flip chip package, a negative, edge-downward curvature ("crying" warpage) results after chip attach and underfill processes are completed. This is expected based on the CTE (coefficient of thermal expansion) mismatch between the chip silicon and the package substrate. The resulting curvature makes it extremely difficult to meet coplanarity specifications.

In addition, the multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a chip are so small, it is difficult to test chips before assembly onto a substrate.

Thus, it is desirable that when chips are mounted and connected individually, the chip and connections can be tested individually, and only known-good-die ("KGD") or chips that are free of defects are then assembled into larger circuits.

A fabrication process that uses KGD is therefore more reliable and less prone to assembly defects introduced due to bad chips. With conventional multi-chip modules, however, the chip cannot be individually identified as KGD before final assembly, leading to KGD inefficiencies and assembly process yield problems.

Another size reducing design is package level stacking or package on package (PoP) stacking. This concept includes stacking of two or more packages. KGD and assembly process yields are not an issue since each package can be tested prior to assembly, allowing KGD to be used in assembling the stack.

But package level stacking can pose other problems. One problem is package-to-package assembly process difficulties caused by irregularities in the flatness/coplanarity of the lower package. Another problem results from the desirability of making connections through stacked packages or between packages where one package may block connection of another package.

Thus, despite the advantages of recent developments in semiconductor fabrication and packaging techniques, there is a continuing need for improved packaging methods, systems, and designs for increasing semiconductor chip density in PCB assemblies.

Thus, a need still remains for an efficient 3D package stacking process. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having a component side and a system side; depositing a solder resist layer on the component side of the package substrate; patterning groups of access openings and a die mount opening in the solder resist layer; attaching an integrated circuit die in the die mount opening; forming conductive contacts in the access openings; and attaching system interconnects to the system side of the package substrate including controlling a coplanarity of the system interconnects by the solder resist layer.

The present invention provides an integrated circuit packaging system, including: a package substrate having a component side and a system side; a solder resist layer, on the component side of the package substrate, having groups of access openings and a die mount opening patterned therein; an integrated circuit die attached in the die mount opening; conductive contacts formed in the access openings; and system interconnects attached to the system side of the package substrate includes the coplanarity of the system interconnects secured by the solder resist layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
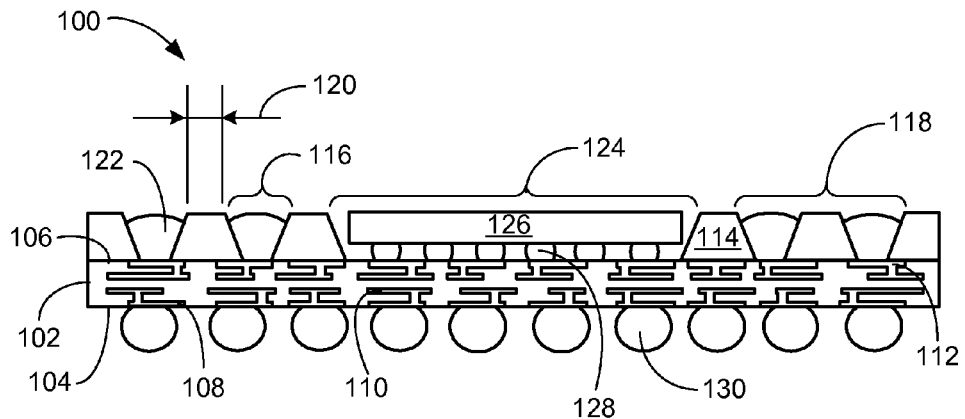
FIG. 1 is a cross-sectional view of an integrated circuit packaging system in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the device are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, the same numbers are used in all the drawing FIGs. to relate to the same elements.

The term "horizontal" as used herein is defined as a plane parallel to the conventional plane or surface of the attached chip regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" is defined as meaning there is direct contact between elements or components with no intervening material. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit packaging system 100 in an embodiment of the present invention. The cross-sectional view of the integrated circuit packaging system 100 depicts a package substrate 102, such as a laminate substrate, a flex circuit substrate, or an organic material substrate, having a system side 104 and a component side 106.

System contacts 108 may be formed on the system side 104 of the package substrate 102. Internal circuitry 110, such as vias, traces, or a combination thereof, may couple the system contacts 108 to component contacts 112 on the component side 106.

A solder resist layer 114, such as a dry film photo resist or a liquid photo resist, which is capable of photo processing may be applied to the component side 106 of the package substrate 102. The solder resist layer 114 may be applied in a thickness range of 50 to 150 µm.

The solder resist layer 114 can be applied during the assembly process by screen printing techniques or during the manufacturing of the package substrate 102. In some cases, the solder mask material, which is known in substrate manufacturing, may also be suitable for use as the solder resist layer 114 though multiple applications of the solder mask material may be used to meet the thickness requirement for the specific design of the package substrate 102.

It has been discovered that the coefficient of thermal expansion (CTE) and curing shrinkage of the material used for the solder resist layer 114, as well as the thickness and coverage area, can be used to induce a calculated amount of "reverse" warpage that effectively offsets the effect of the original, "negative", warpage resulting in an effectively warpage-free package. This aspect of the present invention provides a means for controlling the coplanarity of the integrated circuit packaging system 100.

Access openings 116 may be patterned across the surface of the solder resist layer 114. While the access openings 116 are shown having sloped sides, this is an example only and the sides of the access opening may have a different slope. The access openings 116 may each expose one of the component contacts 112 on the component side 106 of the package substrate 102.

A group 118 of the access openings 116 includes at least two of the access openings 116 with a separation distance 120 that is preferable, but not limited to, less than the thickness of the solder resist layer 114 and greater than the smallest dimension of the access opening 116. This use of the separation distance 120 prevents an unintended coupling when conductive contacts 122, such as solder or conductive epoxy, may be deposited in the group 118 of the access openings 116. It has been discovered that the surface tension of the conductive contacts 122 will prevent an inadvertent coupling across the separation distance 120.

A die mount opening 124, such as a larger opening that may expose an array of the component contacts 112. An integrated circuit die 126, such as a flip chip die, may be coupled to the array of the component contacts 112 by chip interconnects 128. The chip interconnects 128, such as solder balls, may position the inactive side of the integrated circuit die 126 even with or below the level of the solder resist layer 114.

The conductive contacts 122 may be deposited in the access openings 116 in order to provide signal connectivity through the component contacts 112 to the integrated circuit die 126, system interconnects 130, or a combination thereof. The system interconnects 130, such as solder balls, solder columns, solder bumps, or stud bumps, may provide a connection means between the integrated circuit packaging system 100 and another system not shown. The number and position of the system interconnects 130 is an example only and the actual number and position may differ.

It has further been discovered that material of the solder resist layer 114 having a relatively high CTE, limited filler loading, and high curing shrinkage factor provides the best characteristics for controlling the coplanarity of the integrated circuit packaging system 100. The structural response of the solder resist layer 114 can be calculated based on relatively high CTE value, limited filler loading amount, and high curing shrinkage factor number. The thickness and position of the solder resist layer 114 can all be determined without undue experimentation and can be adjusted for the various materials and density of the package substrate 102.

Figure 2:
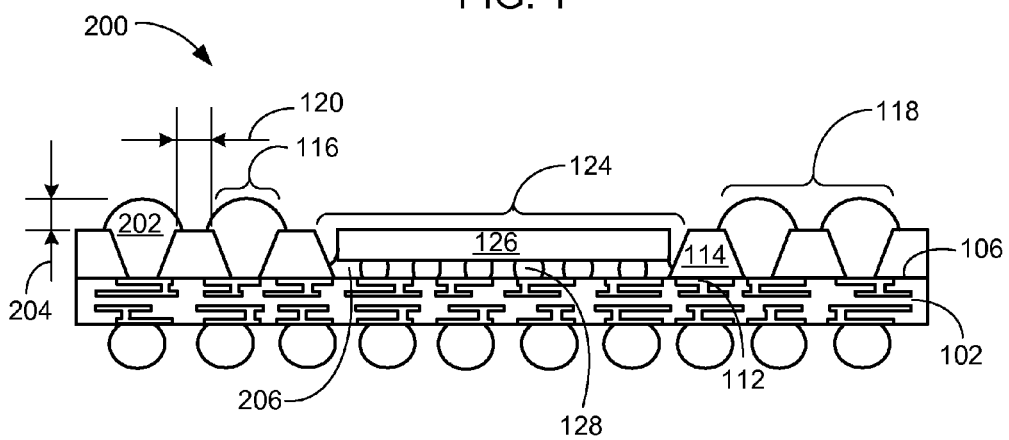
FIG. 2 is a cross-sectional view of an integrated circuit packaging system in an alternate embodiment of the present invention.

Referring now to FIG. 2, therein is shown a cross-sectional view of an integrated circuit packaging system 200 in an alternate embodiment of the present invention. The cross-sectional view of the integrated circuit packaging system 200 depicts the package substrate 102 having the solder resist layer 114 patterned on the component side 106.

The solder resist layer 114 may be a resin having a relatively high CTE, limited filler loading, and high curing shrinkage factor in order to provide the best control of the coplanarity of the package substrate 102. The group 118 of the access openings 116 having the separation distance 120 prevents inadvertent coupling of the signals present on the component contacts 112. It has been discovered that this aspect of the invention provides a means to create elevated contacts 202, such as solder or conductive epoxy, which may protrude above the solder resist layer 114 by a height 204 without bridging the separation distance 120.

The height 204 of the elevated contacts 202 may be precisely adjusted based on the surface tension of the conductive material used to form the elevated contacts 202. Typically the elevated contacts 202 would be formed of solder or conductive epoxy, which may provide a predictable intrusion into the separation distance 120 without allowing a coupling between adjacent positions of the access opening 116.

A liquid adhesive 206, such as an underfill material, may be applied between the component side 106 and the integrated circuit die 126 to enclose the chip interconnects 128. The edges of the die mount opening 124 formed by the solder resist layer 114 may act as a "dam" for limiting bleed, or excess flow, of the liquid adhesive 206. The liquid adhesive 206 may increase the rigidity of the integrated circuit packaging system 200 and further enhance the ability to maintain the coplanarity specification.

Figure 3:
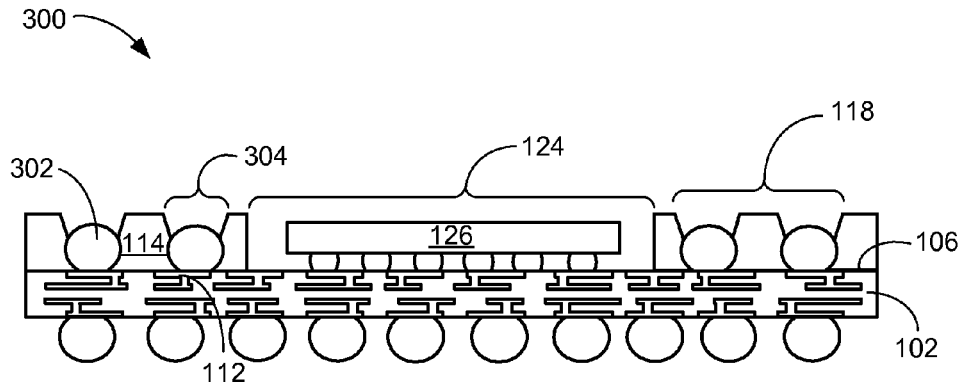
FIG. 3 is a cross-sectional view of an integrated circuit packaging system in a further alternate embodiment of the present invention.

Referring now to FIG. 3, therein is shown a cross-sectional view of an integrated circuit packaging system 300 in a further alternate embodiment of the present invention. The cross-sectional view of the integrated circuit packaging system 300 depicts the package substrate 102 with interface interconnects 302, such as solder balls, solder columns, solder bumps, conductive pillars, or stud bumps, electrically connected to the component contacts 112.

The solder resist layer 114 may be applied on the component side 106 of the package substrate 102 and the interface interconnects 302. Coupling ports 304 may be formed by removing the solder resist layer 114 over the interface contacts 302. The group 118 of the coupling ports 304 may be in closer proximity since there is no risk of inadvertent coupling of the signals associated with the component contacts.

The shape of the coupling ports 304 is an example only and the actual shape is limited only by the tooling required to remove the solder resist layer and form any subsequent coupling to the interface interconnects 302. Further the number and position of the interface interconnects 302 is an example only and the actual number may differ.

The die mount opening 124 and the integrated circuit die 126 are shown centrally located on the component side 106 but this is an example only and the die mount opening 124 may be positioned anywhere that would provide additional support for the package substrate 102. In this example the die mount opening 124 is shown having vertical sides though that may be different if additional support was required to meet the coplanarity specification of the integrated circuit packaging system 300.

Figure 4:
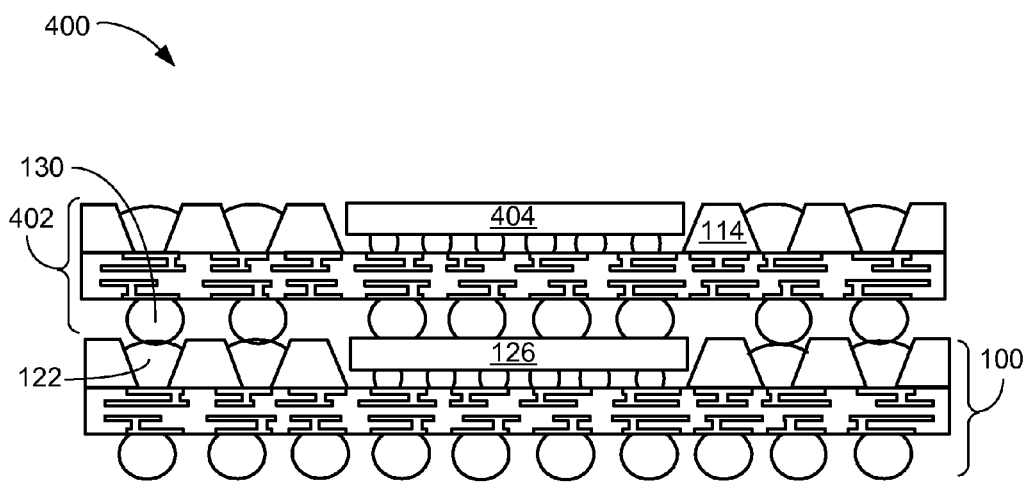
FIG. 4 is a cross-sectional view of a stacked package utilizing the integrated circuit packaging system of FIG. 1.

Referring now to FIG. 4, therein is shown a cross-sectional view of a stacked package 400 utilizing the integrated circuit packaging system 100 of FIG. 1. The cross-sectional view of the stacked package 400 depicts the integrated circuit packaging system 100 having a second integrated circuit packaging system 402 mounted thereon.

The integrated circuit die 126 of the integrated circuit packaging system 100 may include through silicon vias (not shown) for forming a signal connection between the integrated circuit die 126 and the system interconnects 130 of the second integrated circuit packaging system 402. Alternatively the system interconnects 130 of the second integrated circuit packaging system 402 may be coupled to the inactive side of the integrated circuit die 126 in order to provide a thermal path for conducting heat away from the integrated circuit die 126.

While the stacked package 400 depicts the integrated circuit packaging system 100 with the second integrated circuit packaging system 402 stacked thereon, this is an example only and additional packaging systems may be stacked over the second integrated circuit packaging system 402 in a similar manner. The configuration and coupling between the system interconnects 130 of the second integrated circuit packaging system 402 and the conductive contacts 122 of the integrated circuit packaging system 100 is an example only and a different number and configuration may be implemented.

It has been discovered that the application of the solder resist layer 114 in both the integrated circuit packaging system 100 and the second integrated circuit packaging system 402 may provide a control for maintaining the coplanarity specification in both of the packaging systems. The result provides the stacked package 400 having coplanarity controls for the system interconnects 130 as well as the conductive contacts 122.

The second integrated circuit packaging system 402 may include a second integrated circuit die 404. The stacked package 400 provides electrical coupling between the integrated circuit die 126, the second integrated circuit die 404, the conductive contacts 122 of the integrated circuit packaging system 100, the system interconnects 130 of the second integrated circuit packaging system 402, or a combination thereof.

Figure 5:
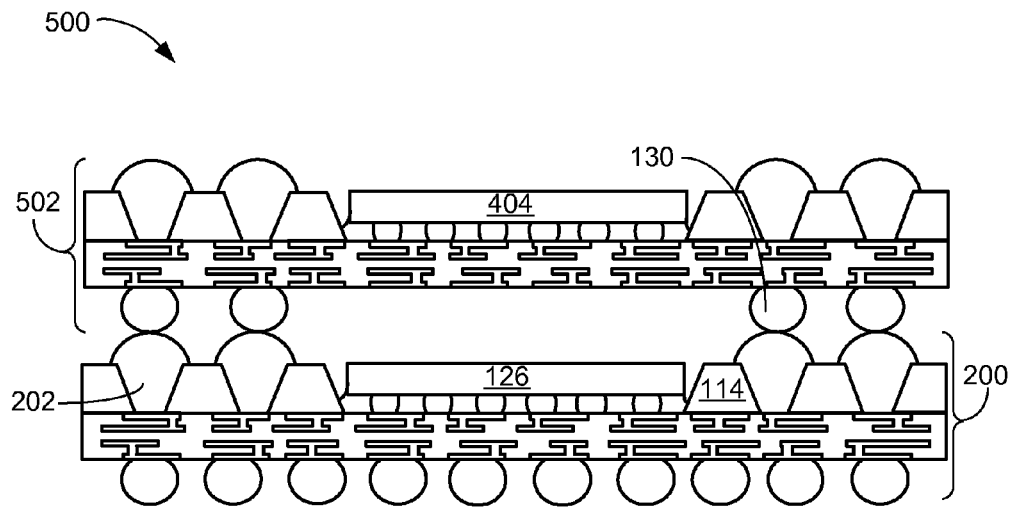
FIG. 5 is a cross-sectional view of a stacked package utilizing the integrated circuit packaging system of FIG. 2.

Referring now to FIG. 5, therein is shown a cross-sectional view of a stacked package 500 utilizing the integrated circuit packaging system 200 of FIG. 2. The cross-sectional view of the stacked package 500 depicts the integrated circuit packaging system 200 having a second integrated circuit packaging system 502 mounted thereon.

The integrated circuit die 126 of the integrated circuit packaging system 200 may be spaced away from the system side 104 of the package substrate 102 in the second integrated circuit packaging system 502 in order to provide air flow for conducting heat away from the integrated circuit die 126.

While the stacked package 500 depicts the integrated circuit packaging system 200 with the second integrated circuit packaging system 502 stacked thereon, this is an example only and additional packaging systems may be stacked over the second integrated circuit packaging system 502 in a similar manner. The configuration and coupling between the system interconnects 130 of the second integrated circuit packaging system 502 and the elevated contacts 202 of the integrated circuit packaging system 200 is an example only and a different number and configuration may be implemented.

It has been discovered that the application of the solder resist layer 114 in both the integrated circuit packaging system 200 and the second integrated circuit packaging system 502 may provide a control for maintaining the coplanarity specification in both of the packaging systems. The result provides the stacked package 500 having coplanarity controls for the system interconnects 130 as well as the elevated contacts 202.

The second integrated circuit packaging system 502 may include the second integrated circuit die 404. The stacked package 500 provides electrical coupling between the integrated circuit die 126, the second integrated circuit die 404, the elevated contacts 202 of the integrated circuit packaging system 200, the system interconnects 130 of the second integrated circuit packaging system 502, or a combination thereof.

Figure 6:
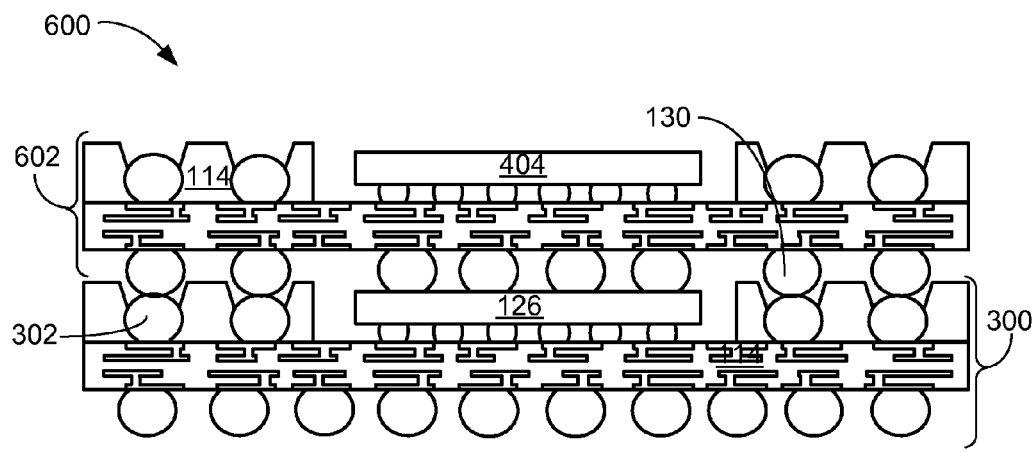
FIG. 6 is a cross-sectional view of a stacked package utilizing the integrated circuit packaging system of FIG. 3.

Referring now to FIG. 6, therein is shown a cross-sectional view of a stacked package 600 utilizing the integrated circuit packaging system 300 of FIG. 3. The cross-sectional view of the stacked package 600 depicts the integrated circuit packaging system 300 having a second integrated circuit packaging system 602 mounted thereon.

The integrated circuit die 126 of the integrated circuit packaging system 300 may include through silicon vias (not shown) for forming a signal connection between the integrated circuit die 126 and the system interconnects 130 of the second integrated circuit packaging system 602. Alternatively the system interconnects 130 of the second integrated circuit packaging system 602 may be coupled to the inactive side of the integrated circuit die 126 in order to provide a thermal path for conducting heat away from the integrated circuit die 126.

While the stacked package 600 depicts the integrated circuit packaging system 300 with the second integrated circuit packaging system 602 stacked thereon, this is an example only and additional packaging systems may be stacked over the second integrated circuit packaging system 602 in a similar manner. The configuration and coupling between the system interconnects 130 of the second integrated circuit packaging system 602 and the interface interconnects 302 of the integrated circuit packaging system 300 is an example only and a different number and configuration may be implemented.

It has been discovered that the application of the solder resist layer 114 in both the integrated circuit packaging system 300 and the second integrated circuit packaging system 602 may provide a control for maintaining the coplanarity specification in both of the packaging systems. The result provides the stacked package 600 having coplanarity controls for the system interconnects 130 as well as the interface interconnects 302.

The second integrated circuit packaging system 602 may include the second integrated circuit die 404. The stacked package 600 provides electrical coupling between the integrated circuit die 126, the second integrated circuit die 404, the interface interconnects 302 of the integrated circuit packaging system 300, the system interconnects 130 of the second integrated circuit packaging system 602, or a combination thereof.

Figure 7:
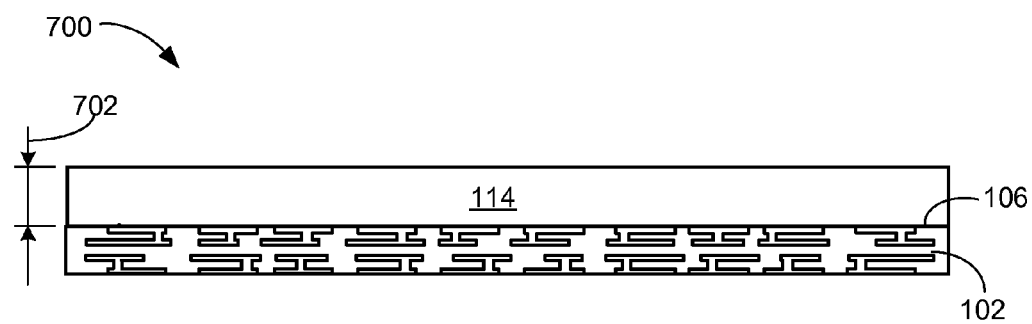
FIG. 7 is a cross-sectional view of a package substrate assembly in an additional embodiment of the present invention.

Referring now to FIG. 7, therein is shown a cross-sectional view of a package substrate assembly 700 in an additional embodiment of the present invention. The cross-sectional view of the package substrate assembly 700 depicts the package substrate 102 having the component side 106 completely covered by the solder resist layer 114.

The solder resist layer 114 may have a thickness 702 in the range of 50 to 150 μm. The solder resist layer 114 may provide additional rigidity to the package substrate 102 during the assembly process. The solder resist layer 114 can be placed by a number of different processes such as lamination, spin coating, or spray coating.

Figure 8:
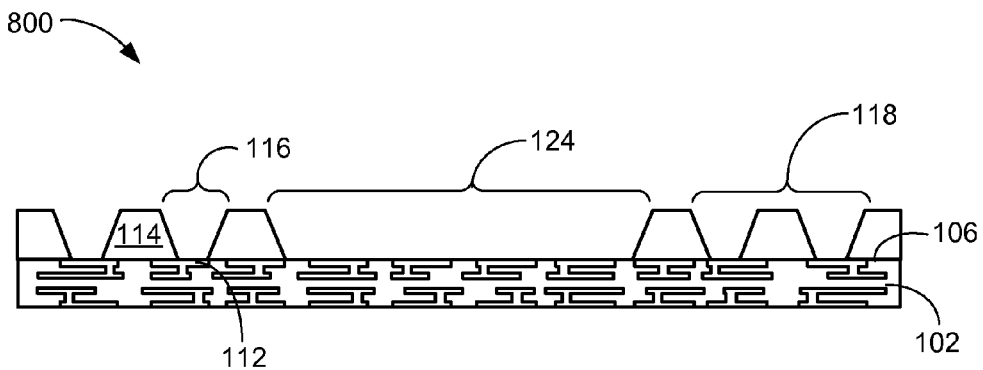
FIG. 8 is a cross-sectional view of a patterned package substrate assembly in the additional embodiment of the present invention.

Referring now to FIG. 8, therein is shown a cross-sectional view of a patterned package substrate assembly 800 in the additional embodiment of the present invention. The cross-sectional view of the patterned package substrate assembly 800 depicts the solder resist layer 114 having the access openings 116 formed over the component contacts 112 on the component side of the package substrate 102.

The access openings may be formed in the groups 118 positioned to provide support to control the coplanarity specification of the integrated circuit packaging system 100, of FIG. 1. The die mount opening 124 is shown centralized in the package substrate 102, but this is an example only and the actual position of the die mount opening may differ. The access openings 116 and the die mount opening 124 may be formed by a photographic exposure and wash or etch process.

Figure 9:
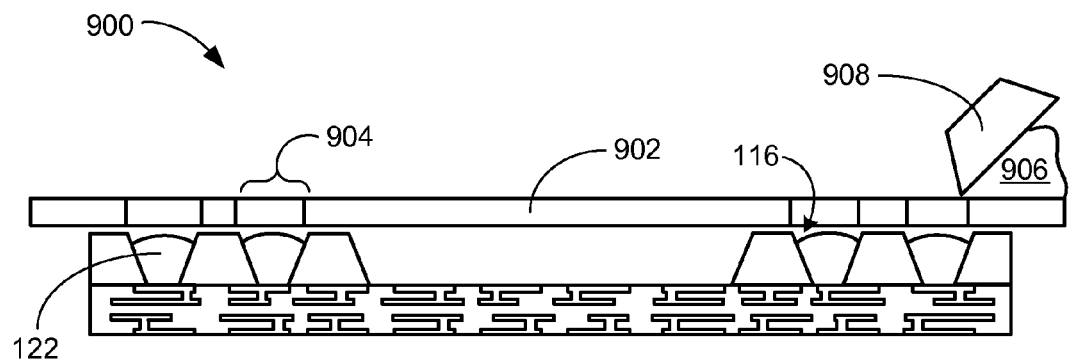
FIG. 9 is a cross-sectional view of a deposition process for the patterned package substrate assembly in the additional embodiment of the present invention.

Referring now to FIG. 9, therein is shown a cross-sectional view of a deposition process 900 for the patterned package substrate assembly 800 in the additional embodiment of the present invention. The cross-sectional of the deposition process 900 depicts the patterned package substrate assembly 800 having the conductive contacts 122 deposited in the access openings 116.

A stencil 902 may be used to deposit a measured amount of a material to form the conductive contacts 122. Deposition openings 904 may allow a measured amount of a conductive adhesive 906 to be deposited in each of the access openings 116.

A squeegee 908 may be used to force the measured amount of the conductive adhesive 906 into the access openings 116 through the deposition openings 904. The conductive adhesive 906 is then subjected to a curing process, such as reflow or epoxy curing, to form the conductive contact 122 in the access openings 116.

Figure 10:
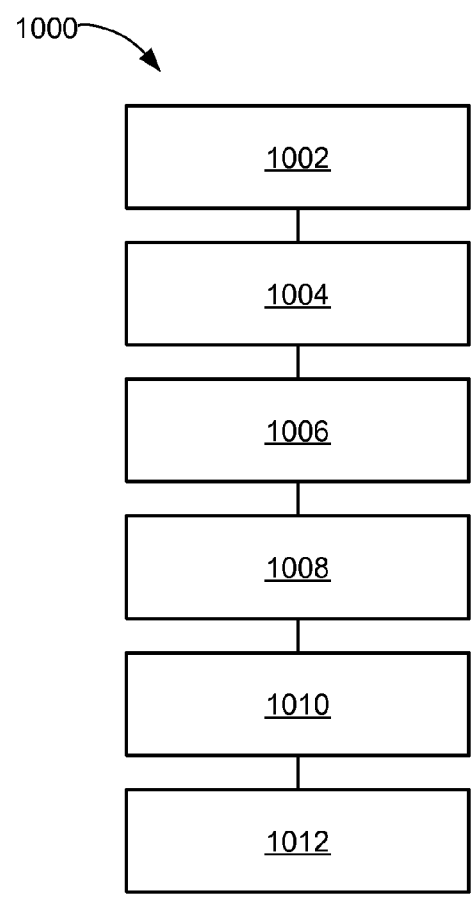
FIG. 10 is a flow chart of a method of manufacture of the integrated circuit packaging system in an embodiment of the present invention.

Referring now to FIG. 10, therein is shown a flow chart of a method 1000 of manufacture of the integrated circuit packaging system in an embodiment of the present invention. The method 1000 includes: providing a package substrate having a component side and a system side in a block 1002; depositing a solder resist layer on the component side of the package substrate in a block 1004; patterning groups of access openings and a die mount opening in the solder resist layer in a block 1006; attaching an integrated circuit die in the die mount opening in a block 1008; forming conductive contacts in the access openings in a block 1010; and attaching system interconnects to the system side of the package substrate including controlling a coplanarity of the system interconnects by the solder resist layer in a block 1012.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package-on-package stacking systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package substrate having a component side and a system side;
   depositing a solder resist layer on the component side of the package substrate, the solder resist layer having a thickness range of 50 to 150 µm for preventing warpage of the package substrate;
   patterning groups of access openings and a die mount opening in the solder resist layer;
   attaching an integrated circuit die in the die mount opening;
   forming conductive contacts in the access openings; and
   attaching system interconnects to the system side of the package substrate.

2. The method as claimed in claim 1 further comprising forming component contacts on the component side coupled to system contacts on the system side through internal circuitry.

3. The method as claimed in claim 1 further comprising establishing a separation distance between the access openings in the groups.

4. The method as claimed in claim 1 wherein forming the conductive contacts includes forming elevated contacts in the access openings.

5. The method as claimed in claim 1 further comprising attaching a second integrated circuit packaging system to the conductive contacts by coupling system interconnects of the second integrated circuit packaging system to the conductive contacts.

6. A method of manufacture of an integrated circuit packaging system comprising:
   providing a package substrate having a component side and a system side includes component contacts on the component side coupled to system contacts on the system side through traces and vias;
   depositing a solder resist layer on the component side of the package substrate includes applying a dry photoresist or liquid photoresist on the component side, the solder resist layer having a thickness range of 50 to 150 µm for preventing warpage of the package substrate;
   patterning groups of access openings and a die mount opening in the solder resist layer;
   attaching an integrated circuit die in the die mount opening includes coupling chip interconnects between the component contacts and the integrated circuit die;
   forming conductive contacts in the access openings includes forming elevated contacts; and
   attaching system interconnects to the system side of the package substrate.

7. The method as claimed in claim 6 wherein depositing the solder resist layer on the component side includes the solder resist layer having the thickness in the range of 50 to 100 µm measured from the component side.

8. The method as claimed in claim 6 further comprising establishing a separation distance between the access openings in the groups including allowing the elevated contacts to encroach the separation distance without coupling to the elevated contact in an adjacent position.

9. The method as claimed in claim 6 further comprising applying a liquid adhesive between the integrated circuit die and the component side, the liquid adhesive bordered by the die mount opening.

10. The method as claimed in claim 6 further comprising attaching a second integrated circuit packaging system to the conductive contacts by coupling system interconnects of the second integrated circuit packaging system to the conductive contacts, the second integrated circuit packaging system includes a second integrated circuit die; and the integrated circuit die, the conductive contacts of the integrated circuit packaging system, or a combination thereof electrically connected to the second integrated circuit packaging system.

11. An integrated circuit packaging system comprising:
    a package substrate having a component side and a system side;
    a solder resist layer, on the component side of the package substrate, having groups of access openings and a die mount opening patterned therein, the solder resist layer having a thickness range of 50 to 150 µm for preventing warpage of the package substrate;
    an integrated circuit die attached in the die mount opening;
    conductive contacts formed in the access openings; and
    system interconnects attached to the system side of the package substrate.

12. The system as claimed in claim 11 further comprising component contacts on the component side coupled to system contacts on the system side by internal circuitry.

13. The system as claimed in claim 11 wherein the groups of the access openings include a first of the access openings patterned a separation distance away from a second of the access openings.

14. The system as claimed in claim 11 wherein the conductive contacts in the access openings are elevated contacts.

15. The system as claimed in claim 11 further comprising a second integrated circuit packaging system coupled to the conductive contacts by system interconnects of the second integrated circuit packaging system.

16. The system as claimed in claim 11 wherein:
    the solder resist layer includes a dry photoresist or liquid photoresist on the component side;
    the conductive contacts are elevated contacts; and
    component contacts on the component side coupled to system contacts on the system side through traces and vias.

17. The system as claimed in claim 16 wherein the solder resist layer on the component side includes the thickness of the solder resist layer in the range of 50 to 150 µm measured from the component side.

18. The system as claimed in claim 16 wherein the groups of the access openings include a first of the access openings patterned a separation distance away from a second of the access openings in which the elevated contacts encroach the separation distance but do not couple to the elevated contacts in an adjacent position.

19. The system as claimed in claim 16 further comprising a liquid adhesive between the integrated circuit die and the component side, the liquid adhesive bordered by the die mount opening.

20. The system as claimed in claim 16 further comprising a second integrated circuit packaging system attached to the conductive contacts by system interconnects of the second integrated circuit packaging system, the second integrated circuit packaging system includes a second integrated circuit die; and
    wherein the integrated circuit die, the conductive contacts of the integrated circuit packaging system, or a combination thereof are electrically connected to the second integrated circuit packaging system.

* * * * *